(12) United States Patent
Ohashi et al.

(10) Patent No.: US 12,094,731 B2
(45) Date of Patent: Sep. 17, 2024

(54) SUBSTRATE DRYING APPARATUS

(71) Applicant: EBARA CORPORATION, Tokyo (JP)

(72) Inventors: Hirotaka Ohashi, Tokyo (JP); Takuya Tsushima, Tokyo (JP); Fumiya Okazaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 867 days.

(21) Appl. No.: 17/161,620

(22) Filed: Jan. 28, 2021

(65) Prior Publication Data

US 2021/0249281 A1    Aug. 12, 2021

(30) Foreign Application Priority Data

Feb. 10, 2020 (JP) ................. 2020-020565

(51) Int. Cl.
   *H01L 21/67* (2006.01)
(52) U.S. Cl.
   CPC ............. *H01L 21/67034* (2013.01)
(58) Field of Classification Search
   None
   See application file for complete search history.

(56) References Cited

U.S. PATENT DOCUMENTS

2019/0099847 A1* 4/2019 Ran .................. B28D 7/02

FOREIGN PATENT DOCUMENTS

| CN | 101871721 A | * 10/2010 | .......... G02F 1/1303 |
|---|---|---|---|
| JP | 2001050660 | 2/2001 | |
| JP | 2002158205 | 5/2002 | |
| JP | 2017154111 | 9/2017 | |
| JP | 2018006404 | 1/2018 | |

* cited by examiner

*Primary Examiner* — Jason Lau
(74) *Attorney, Agent, or Firm* — JCIPRNET

(57) ABSTRACT

An aspect of the disclosure provides a substrate drying apparatus. The substrate drying apparatus includes: a gripping part, gripping an outer periphery part of a substrate that is square; a substrate nozzle, ejecting gas to the substrate gripped by the gripping part to dry the substrate; and a gripping part nozzle, ejecting gas to the gripping part to dry the substrate. The substrate nozzle is relatively movable with respect to the substrate in a first direction, and is able to eject the gas in the first direction toward the substrate. The gripping part nozzle is relatively movable with respect to the substrate in the first direction, and is able to eject the gas in a second direction intersecting with the first direction. The gripping part nozzle is disposed behind the substrate nozzle in the first direction.

7 Claims, 12 Drawing Sheets

SUBSTRATE DRYING APPARATUS

CROSS-REFERENCE TO RELATED APPLICATION

This application claims the priority benefit of Japanese application serial no. 2020-020565, filed on Feb. 10, 2020. The entirety of the above-mentioned patent application is hereby incorporated by reference herein and made a part of this specification.

BACKGROUND

Technical Field

The invention relates to a substrate drying apparatus which ejects gas to a substrate to dry the substrate.

Description of Related Art

Conventionally, as a means for forming a wire or a bump on a substrate such as a semiconductor wafer, electrolytic plating is widely used. In recent years, as a plating target, it is also required to plate square substrates in addition to common circular substrates.

Generally, a substrate is cleaned after being subjected to a plating process. Then, a drying process is performed to remove a treatment liquid such as water attached to the substrate. Regarding the square substrate, a drying method for removal is known. In such method, gas is ejected to both sides of the substrate to blow off the treatment liquid remaining on the two sides of the substrate. For example, as disclosed in Patent Document 1, a method in which gas is ejected to both sides of a substrate when the substrate is conveyed by a roller is known. In addition, as disclosed in Patent Document 2, a method in which gas is ejected to both sides of a substrate when an end part of the substrate is gripped is known.

PRIOR ART DOCUMENT

Patent Document

[Patent Document 1] Japanese Laid-Open No. 2018-6404
[Patent Document 2] Japanese Laid-Open No. 2002-158205

However, in the method in which the substrate is conveyed by the roller, the concern that the substrate may hit the roller and be damaged when being conveyed may arise. Meanwhile, according to the method of gripping the substrate, the concern of such damage does not arise. Nevertheless, it is possible that the gas is not ejected sufficiently to a vicinity of a contact location of a gripping part on the substrate, and the substrate is not sufficiently dried at this position.

SUMMARY

An aspect of the disclosure provides a substrate drying apparatus. The substrate drying apparatus includes: a gripping part, gripping an outer periphery part of a substrate that is square; a substrate nozzle, ejecting gas to the substrate gripped by the gripping part to dry the substrate; and a gripping part nozzle, ejecting gas to the gripping part to dry the substrate. The substrate nozzle is relatively movable with respect to the substrate in a direction, and is able to eject the gas in the direction toward the substrate. The gripping part nozzle is relatively movable with respect to the substrate in the direction, and is able to eject the gas in a direction intersecting with the direction. The gripping part nozzle is disposed behind the substrate nozzle in the direction.

DESCRIPTION OF THE EMBODIMENTS

The invention provides a substrate drying apparatus capable of sufficiently drying a square substrate.

According to a substrate processing apparatus of the invention, the substrate which is square can be sufficiently dried.

In the following, the embodiments will be described with reference to the drawings. In the following embodiments, components that are substantially the same are labeled with the same reference symbols, and the description thereof will be omitted as appropriate.

Figure 1:
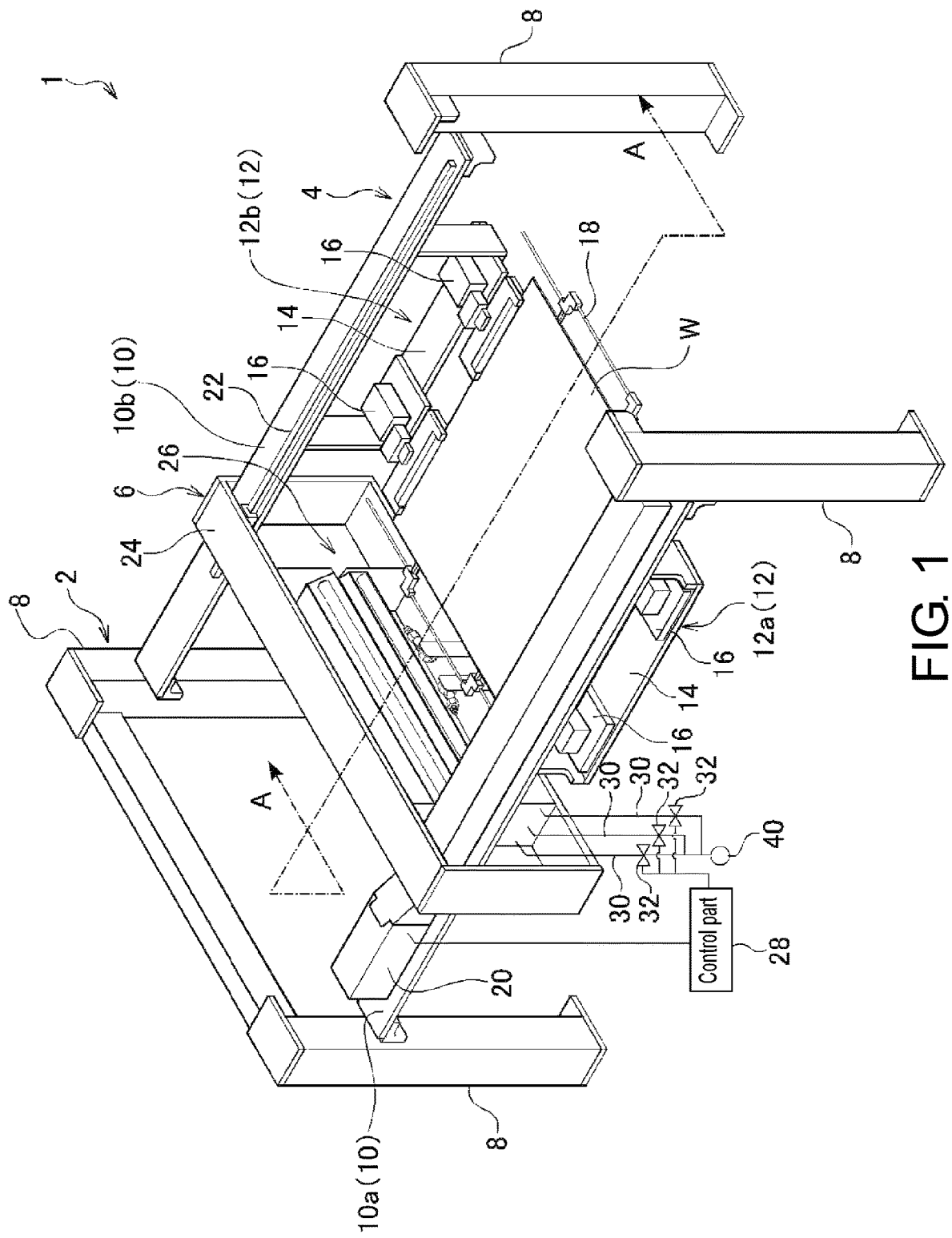
FIG. 1 is a perspective view illustrating an entire configuration of a substrate drying apparatus according to an embodiment.

FIG. 1 is a perspective view illustrating an entire configuration of a substrate drying apparatus according to an embodiment.

In the embodiment, after being subjected to a cleaning process following a plating process, a substrate W which is square and on which a treatment liquid such as water is attached is dried by a substrate drying apparatus 1. The substrate W has an elongated rectangular shape. On the exterior surface (upper surface) and the back surface (lower surface) of the substrate W, there are a mounting region in which a circuit, etc., formed by the plating process is disposed and a non-mounting region in which a circuit, etc., is not disposed. The substrate W is conveyed to the substrate drying apparatus 1 in a mode of being supported in the non-mounting region.

The substrate drying apparatus 1 includes a base part 2, a support mechanism 4, and a drying mechanism 6. The base part 2 forms a framework of the substrate drying apparatus 1. The support mechanism 4 supports the substrate W. The drying mechanism 6 dries the substrate W while moving with respect to the support mechanism 4. The base part 2 includes four support columns 8. A pair of guide members 10a and 10b are provided so as to bridge the support columns 8 (when not particularly distinguished, the guide members 10a and 10b are generally referred to as "guide member(s) 10"). The guide members 10a and 10b respectively extend horizontally and are parallel to each other. The support mechanism 4 has a pair of gripping units 12a and 12b (when not particularly distinguished, the gripping units 12a and 12b are generally referred to as "gripping unit(s) 12") in order to keep the substrate W level during the drying process. The gripping unit 12a is suspended by the guide member 10a, and the gripping unit 12b is suspended by the guide member 10b. In the following, the extending direction of the guide member 10 may be referred to as "front-rear direction".

The gripping unit 12 includes a support stand 14 extending in parallel with the guide member 10 and a pair of clamp mechanisms 16 disposed in the extending direction of the support stand 14. A total of four clamp mechanisms 16 provided in the pair of gripping units 12 sandwich the substrate W to support the substrate W to be level. The clamp mechanism 16 functions as a "gripping part".

The support mechanism 4 includes a frame-shaped support part 18. The support part 18 is supported on the base part 2 by a mechanism not shown herein. The support part 18 supports the substrate W from the lower side. Details about the support part 18 and the clamp mechanism 16 will be described in detail in the following.

The drying mechanism 6 is movably supported along the pair of guide members 10. The front-rear direction, which is the extending direction of the guide member 10, corresponds to the movement direction of the drying mechanism 6. On the upper surface of the guide member 10a, a pulse motor 20 moving the drying mechanism 6 is provided. On the upper surface of the guide member 10b, a guide rail 22 guiding the movement of the drying mechanism 6 is provided. The drying mechanism 6 includes a support stand 24 suspended by the pair of guide members 10 and a nozzle mechanism 26 supported by the support stand 24. The nozzle mechanism 26 ejects gas such as nitrogen from the top and the bottom with respect to the substrate W. Details about the nozzle mechanism 26 will be described in the following.

On the substrate drying apparatus 1, a control part 28 is provided. The control part 28 is formed by a microcomputer and includes a CPU executing various computing processes, a ROM storing a control program, etc., a RAM used as a work area for storing data or executing a program, a non-volatile memory maintaining stored contents even after power is turned off, an interface for input and output, and a timer for timing, etc. The control part 28 controls various mechanisms including the nozzle mechanism 26. While the control part 28 drives and controls the respective mechanisms in the embodiment, it may also be that each mechanism includes a control part. In such case, an integrated control part integrating the control parts of the respective mechanisms may be provided.

The substrate drying apparatus 1 includes a gas supply source 40 storing gas. In addition, three pipes 30 are provided to connect the gas supply source 40 and the nozzle mechanism 26. The pipes 30 are respectively provided with valves 32, whose opening and closing are controlled by the control part 28. The opening and closing control of the valves 32 as well as the introduction of gas to the nozzle mechanism 26 by the control part 28, etc., will be described in detail in the following.

Figure 2:
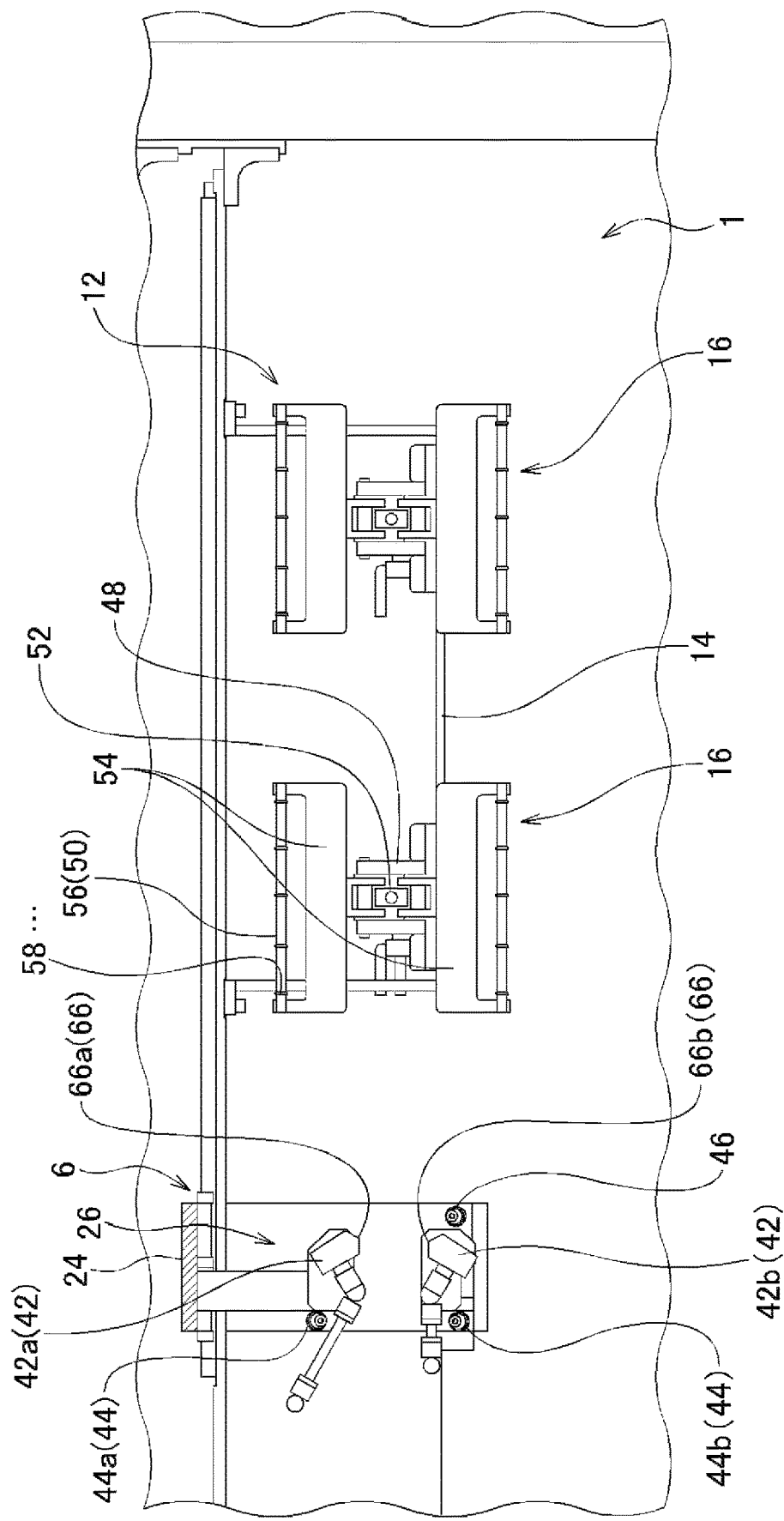
FIG. 2 is a cross-sectional view taken along A-A of FIG. 1.
Figure 3:
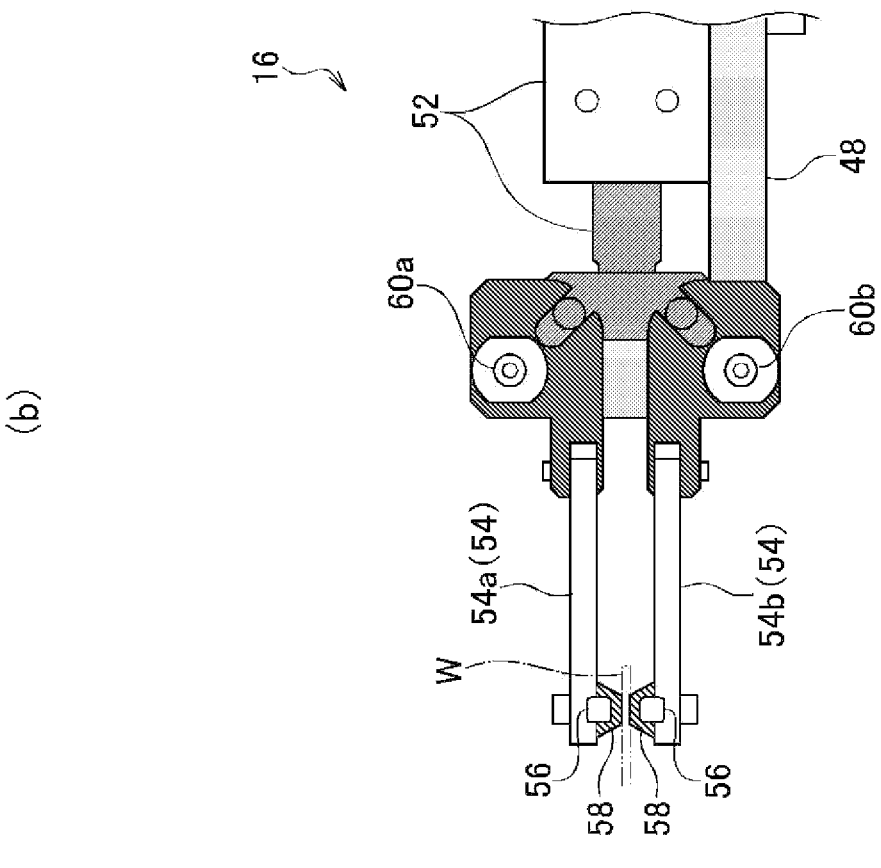
FIG. 3 is a side view illustrating a configuration and an operation of a clamp mechanism.
Figure 3:
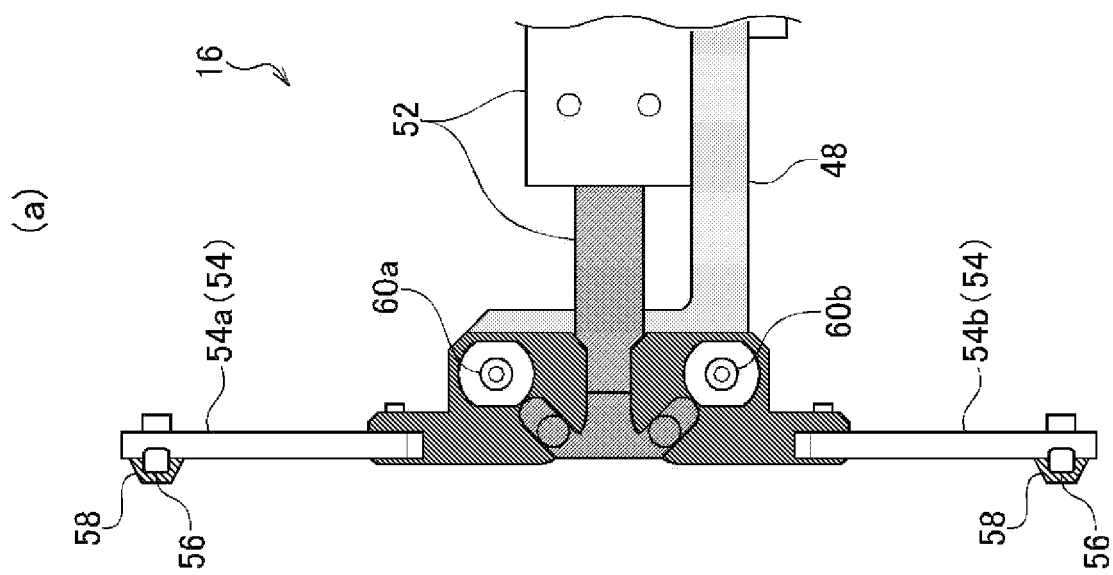

FIG. 2 is a cross-sectional view illustrating the configuration of the substrate drying apparatus 1, which corresponds to the cross-section taken along a line A-A in FIG. 1. FIG. 3 is a side view illustrating the configuration and the operation of the clamp mechanism 16. (a) of FIG. 3 illustrates a non-clamping state, whereas (b) of FIG. 3 illustrates a clamping state.

The clamp mechanism 16 has a base 48 fixed to the support stand 14, upper and lower gripping parts 50 arranged in pair and supported on the base 48, and an air cylinder 52 driving the gripping parts 50. The gripping part 50 includes a T-shaped arm 54 and a sandwiching member 56 fixed to the tip end part of the arm 54. The base end part of the arm 54 is rotatably connected to the base 48. The sandwiching member 56 is a rod-shaped member. The tip end part of the arm 54 is formed in a U shape, and the sandwiching member 56 is provided so as to bridge the two ends thereof. A plurality of O-rings 58 (seal rings) are arranged along the longitudinal direction of the sandwiching member 56.

The nozzle mechanism 26 includes air knives 42, gripping part nozzles 44, and support part nozzles 46. The air knives 42 include upper and lower air knives 42a and 42b arranged in pair. The gripping part nozzles 44 include two sets of upper and lower gripping part nozzles 44a and 44b arranged in pair (while FIG. 2 shows only one set). The air knives 42a and 42b function as "substrate nozzle". The air knife 42 has a slit-like opening part 66 extending horizontally and dries the substrate W (as shown in FIG. 1) by ejecting compressed gas like a thin layer. The air knife 42a has an opening 66a, and the air knife 42b has an opening 66b. The air knife 42a is opened obliquely downward, and the air knife 42b is opened obliquely upward. The opening parts 66a and 66b are coaxially arranged in the upper-lower direction.

The gripping part nozzle 44 is a spray nozzle which linearly ejects compressed gas to dry the vicinities of the gripping positions of the gripping units 12 on the substrate W (shown in FIG. 1). The support part nozzle 46 is also a spray nozzle which linearly ejects compressed gas to dry the vicinity of a contact location with the support part 18 (as shown in FIG. 1) on the substrate W. Details about the configurations of the air knives 42, the gripping part nozzles 44, and the support part nozzles 46 will be described in the following.

As shown in (a) of FIG. 3, in a non-driven state of the clamp mechanism 16, the rod of the air cylinder 52 advances. Therefore, an upper arm 54a rotates about a rotation shaft 60a in the clockwise direction of the drawing, and a lower arm 54b rotates about a rotation shaft 60b in the counter-clockwise direction of the drawing. As a result, the clamp mechanism 16 is changed to an opened state (non-clamping state).

Meanwhile, as shown in (b) of FIG. 3, in a driven state of the clamp mechanism 16, the rod of the air cylinder 52 retreats. Therefore, the arm 54a rotates in the counter-clockwise direction of the drawing, and the arm 54b rotates in the clockwise direction of the drawing. As a result, the clamp mechanism 16 is changed to a state able to sandwich the substrate W (clamping state). In the clamping state, a plurality of pairs of upper and lower O-rings 58 sandwich the outer periphery part of the substrate W. Two O-rings 58 paired in the upper-lower direction are disposed in the thickness direction (upper-lower) of the substrate W.

Figure 4:
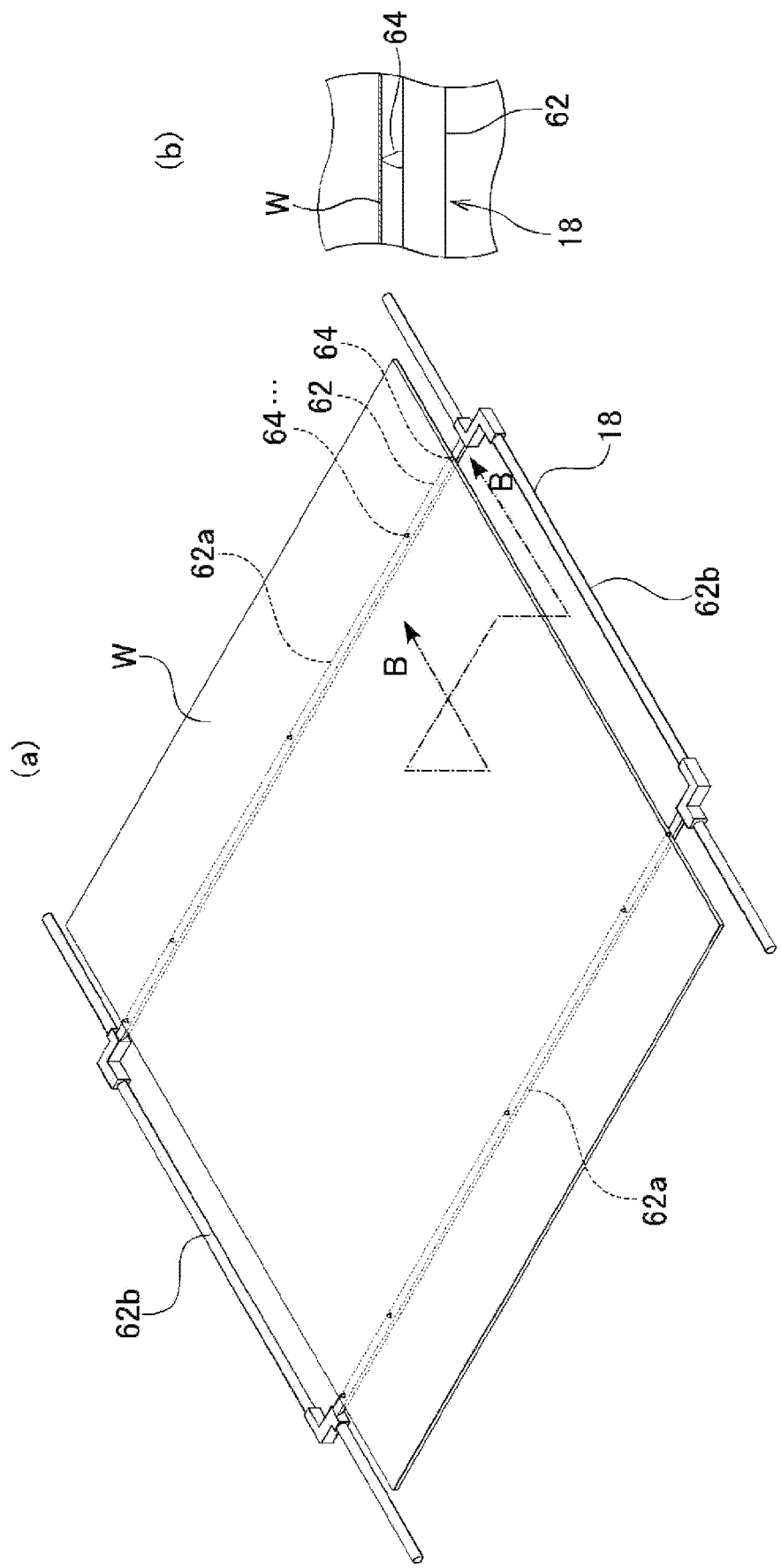
FIG. 4 is a perspective view illustrating a supported state of a substrate W by a support part.
Figure 5:
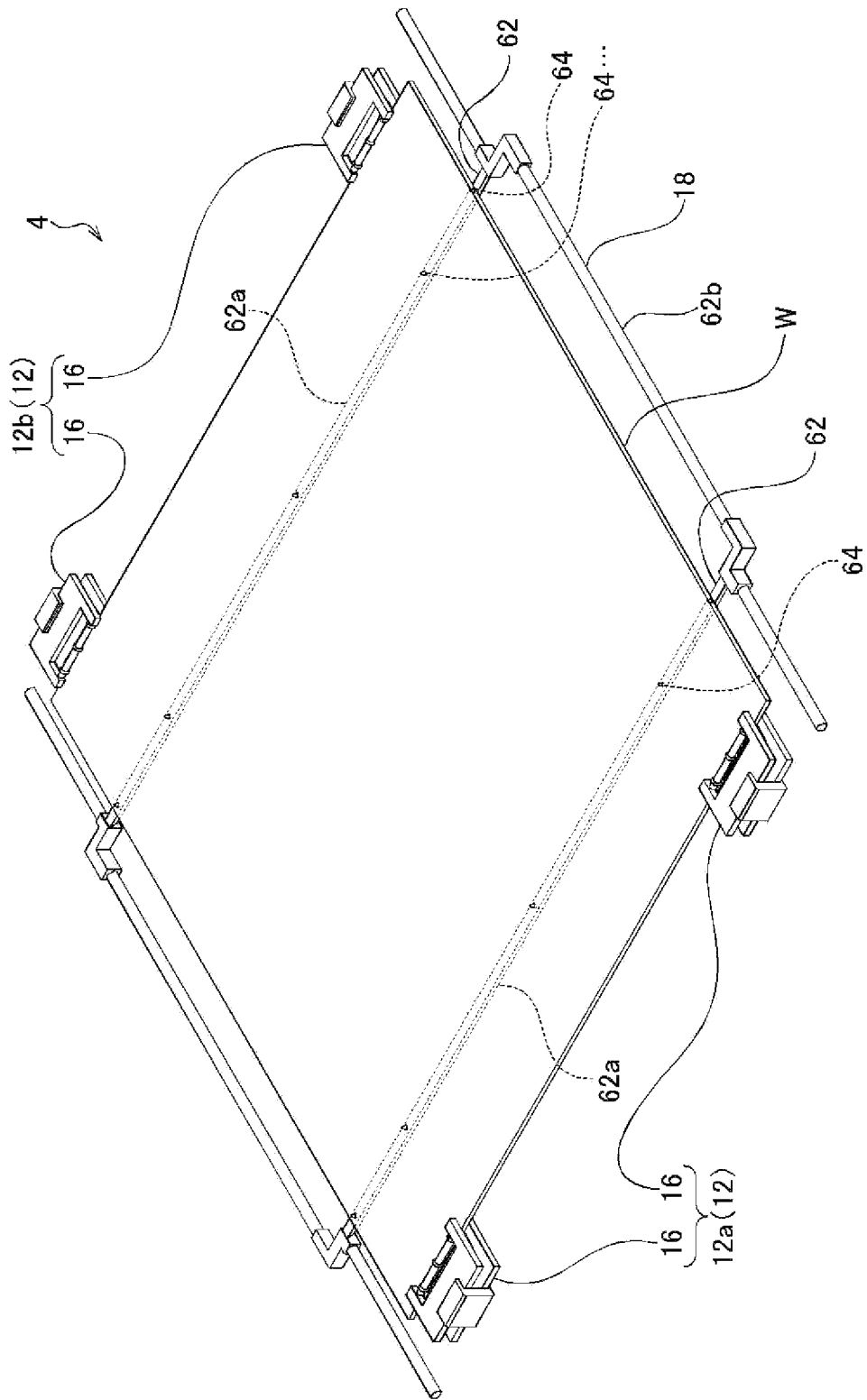
FIG. 5 is a view illustrating a supported mode of the substrate W by a support mechanism.

FIG. 4 is a view illustrating a supported mode of the substrate W by the support part 18. (a) of FIG. 4 is a perspective view, and (b) of FIG. 4 is a cross-sectional view taken along a line B-B in (a) of FIG. 4. FIG. 5 is a perspective view illustrating a supported state of the substrate W by the support mechanism 4.

As shown in (a) of FIG. 4 and FIG. 5, the support part 18 includes a support member 62 which constitutes a rectangular frame shape, and support pins 64. With two long, rod-like members being arranged in parallel, long sides 62a of the support member 62 are formed. With short, rod-like members bridging the end parts of the rod-like members, short sides 62b of the support member 62 are formed. The extending direction of the long side 62a of the support member 62 corresponds to the extending direction of the guide member 10 described with reference to FIG. 1. In the following, the extending direction of the long side 62a of the support member 62 may be referred to as "front-rear direction".

Referring to (a) of FIG. 4 again, in a portion of the support member 62 which constitutes the long side 62a of the support member 62, a plurality of support pins 64 are disposed on the upper surface thereof along the longitudinal direction. In the embodiment, five support pins 64 are disposed on each long side 62a. That is, 10 support pins 64 are disposed with respect to the support member 62. The substrate W is supported from the lower side by the support pins 64 at 10 points.

The substrate W is supported by the support pins 64 in a mode in which the back surface (lower surface) of the substrate W faces the long sides 62a of the support member 62 but does not face the short sides 62b. At this time, a pair of sides among the four sides of the substrate W are supported so as to be parallel to the long sides 62a of the support member 62. As shown in (b) of FIG. 4, the support pin 64 is protrusive. The substrate W makes point contact with the support pin 64 but does not contact the support member 62. With the support pins 64 supporting the substrate W, the contact area between the substrate W and the support part 18 (i.e., the area of the contact location with the support part 18 on the substrate W) can be decreased. As the contact area decreases, the amount of the treatment liquid remaining in the vicinities of the contact locations with the support part 18 on the substrate W also decreases. Therefore, the remaining liquid on the substrate W can be suppressed. The support pins 64 may be integrally formed with the support member 62, and may also be separately formed and assembled to the support member 62.

The support pins 64 may be disposed to cope with a contactable area (non-mounting region for circuits, etc.) of the substrate W. With such configuration, since the support pins 64 do not contact the circuits, etc., the support pins 64 can be prevented from damaging the circuits, etc.

As shown in FIG. 5, the substrate W is supported by the clamp mechanism 16 in addition to the support member 18 in the embodiment. The gripping units 12 are disposed in a mode of facing the long sides 62a of the support member 62 and grip the substrate W. In the embodiment, the gripping unit 12a faces the left side of the substrate W, and the gripping unit 12b faces the right side of the substrate W. The clamp mechanism 16 grips the substrate W in a mode along the side that is faced.

The clamp mechanism 16 and the support part 18 grip and support the substrate W to which the treatment liquid is still attached. Therefore, the contact positions with the support part 18 and the vicinities thereof as well as the vicinities of the contact positions with the clamp mechanism 16 on the substrate W are particularly prone to having remaining treatment liquid. The removal of the treatment liquid at these positions will be described in detail in the following.

In the embodiment, it is assumed that the substrate W is a large-scale, easy-to-bend square substrate. When such substrate W is supported only by the clamp mechanism 16, it is possible that the substrate W is bent due to its own weight, and the substrate W cannot be supported to be level. In addition, the concern that the end part of the substrate W is deviated from the clamp mechanism 16 may arise. With the substrate W being supported by the clamp mechanism 16 as well as the support part 18 in the embodiment, it becomes easy to stably support the substrate W. Moreover, it also becomes easy to keep the substrate W level.

Figure 6:
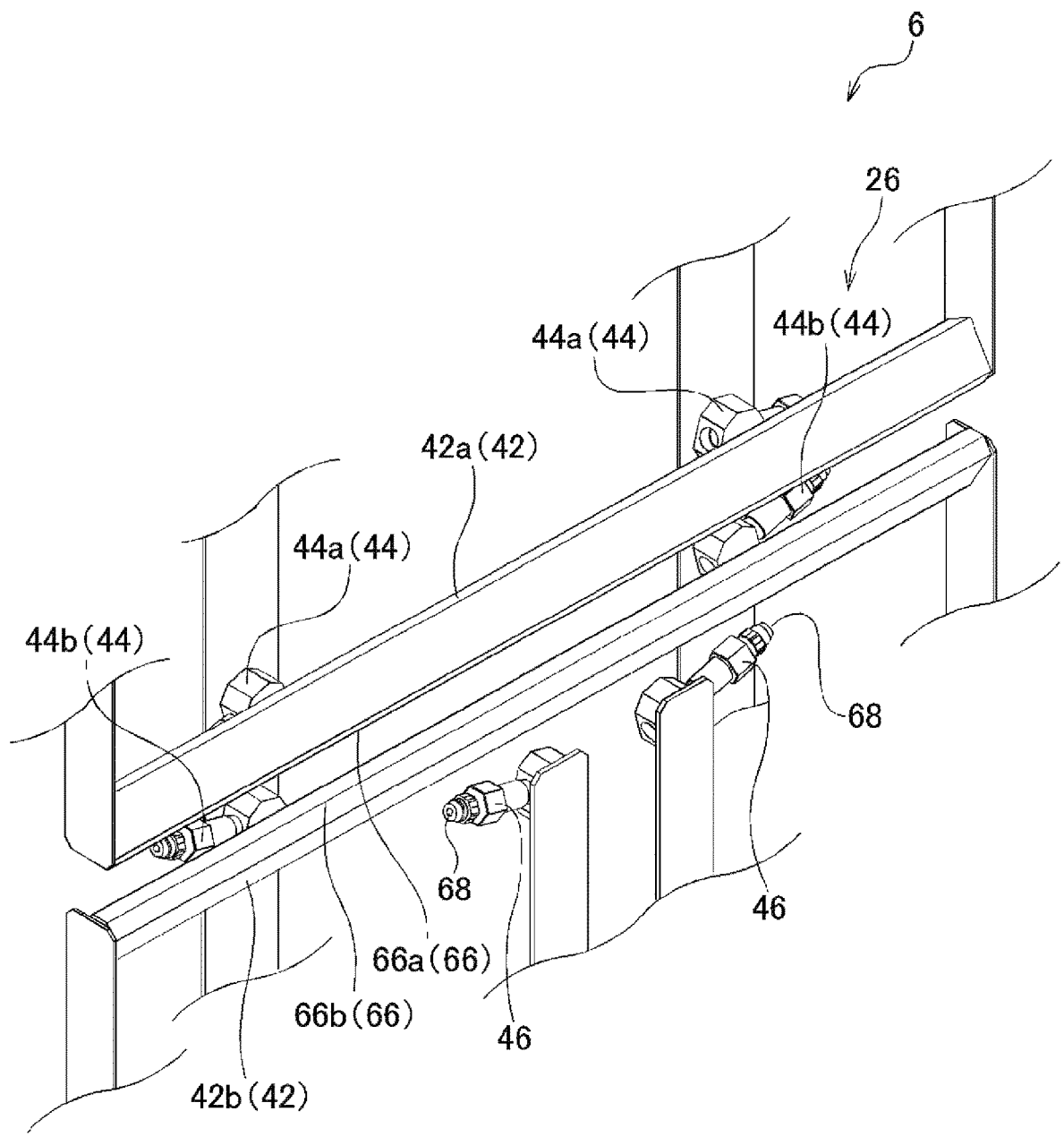
FIG. 6 is a perspective view illustrating a drying mechanism.
Figure 7:
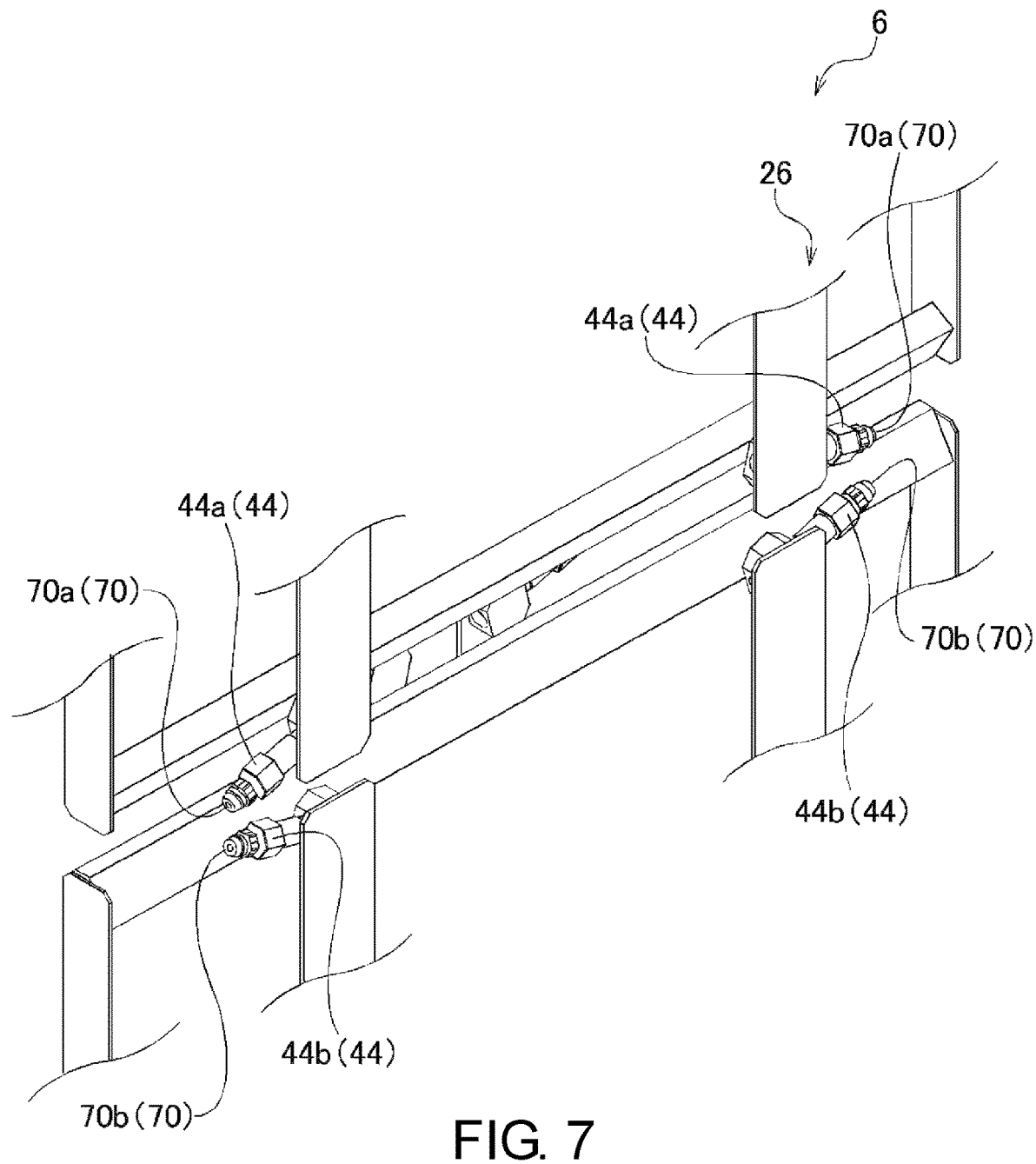
FIG. 7 is a perspective view illustrating the drying mechanism.

FIGS. 6 and 7 is are perspective views illustrating the drying mechanism 6. FIG. 6 illustrates the front surface side of the drying mechanism 6, and FIG. 7 shows the rear surface side of the drying mechanism 6. Here, "front surface side" refers to the front side of the movement direction of the drying mechanism 6, and "rear surface side" refers to the rear side of the movement direction.

As shown in FIG. 6, the air knives 42a and 42b are respectively provided with the slit-like opening parts 66a and 66b (when not particularly distinguished, the opening parts 66a and 66b are generally referred to as "opening part(s) 66") along the extending directions thereof. From the opening parts 66, gas is ejected like a layer. The gas is ejected obliquely forward and downward from the opening part 66a, and is ejected obliquely forward and upward from the opening part 66b. With the gas ejected from the opening parts 66, the exterior surface (upper surface) and the back surface (lower surface) of the substrate W (as shown in FIG. 1) are dried.

Two support part nozzles 46 that are paired each have an opening part 68. From the opening parts 68, gas is ejected linearly. The pair of support part nozzles 46 are disposed to be back to back, and the two opening parts 68 are oriented in directions opposite to each other. The two opening parts 68 are respectively disposed to be slightly upward.

As shown in FIG. 7, the pair of upper and lower gripping parts 44a and 44b are respectively provided with opening parts 70a and 70b (when not particularly distinguished, the opening parts 70a and 70b are generally referred to as "opening part(s) 70"). From the opening parts 70, gas is ejected linearly. The opening parts 70a and 70b are arranged in the upper-lower direction. Two sets of the paired gripping part nozzles 44a and 44b are disposed on the left and the right. The two sets of gripping part nozzles 44 are respectively disposed at positions on the left and the right further from the center of the nozzle mechanism 26 than the support part nozzles 46 (as shown in FIG. 6). The two opening parts 70a are oriented in directions opposite to each other. Similarly, the two opening parts 70b are oriented in directions opposite to each other. The two opening parts 70a are disposed to be slightly downward, and the two opening parts 70b are disposed to be slightly upward.

The opening area of the opening part 66 is significantly larger than the opening area of the opening part 68 and the opening area of the opening part 70. In addition, as described with reference to FIG. 1, gas is supplied from the gas supply source 40 to the nozzle mechanism 26. That is, the air knives 42, the support part nozzles 46, and the gripping part nozzles 44 are supplied with gas from the common gas supply source 40 (as shown in FIG. 1). In addition, gas ejection is performed through opening and closing of the valves 32 (as shown in FIG. 1).

The opening and closing of the valves 32 is controlled by the control part 28. The three pipes 30 are respectively connected to the air knives 42, the gripping part nozzles 44, and the support part nozzles 46 (see FIGS. 6 and 7). By opening the valves 32 respectively provided in the pipes 30, gas is ejected from the air knives 42, the gripping part nozzles 44, or the support part nozzles 46, which are the connection destinations of the respective pipes 30. By respectively performing the opening and closing control on the three valves 32, the control part 28 can selectively drive the air knives 42, the holding part nozzles 44, and the support part nozzles 46.

The pressures of the gas flowing inside the respective pipes 30 in which gas is supplied from the common gas supply source 40 are all the same. Meanwhile, as described with reference to FIGS. 6 and 7, the opening area of the opening part 66 is greater than the opening area of the opening part 68 and is also greater than the opening area of the opening part 70. Therefore, regarding the gas discharge pressure (the pressure of the gas discharged from each opening part), the gas discharge pressure of the opening part 68 having a smaller opening area is greater than the gas discharge pressure of the opening part 66 having a larger opening area. Similarly, compared with the opening part 66, the gas discharge pressure of the opening part 70 is larger.

Figure 8:
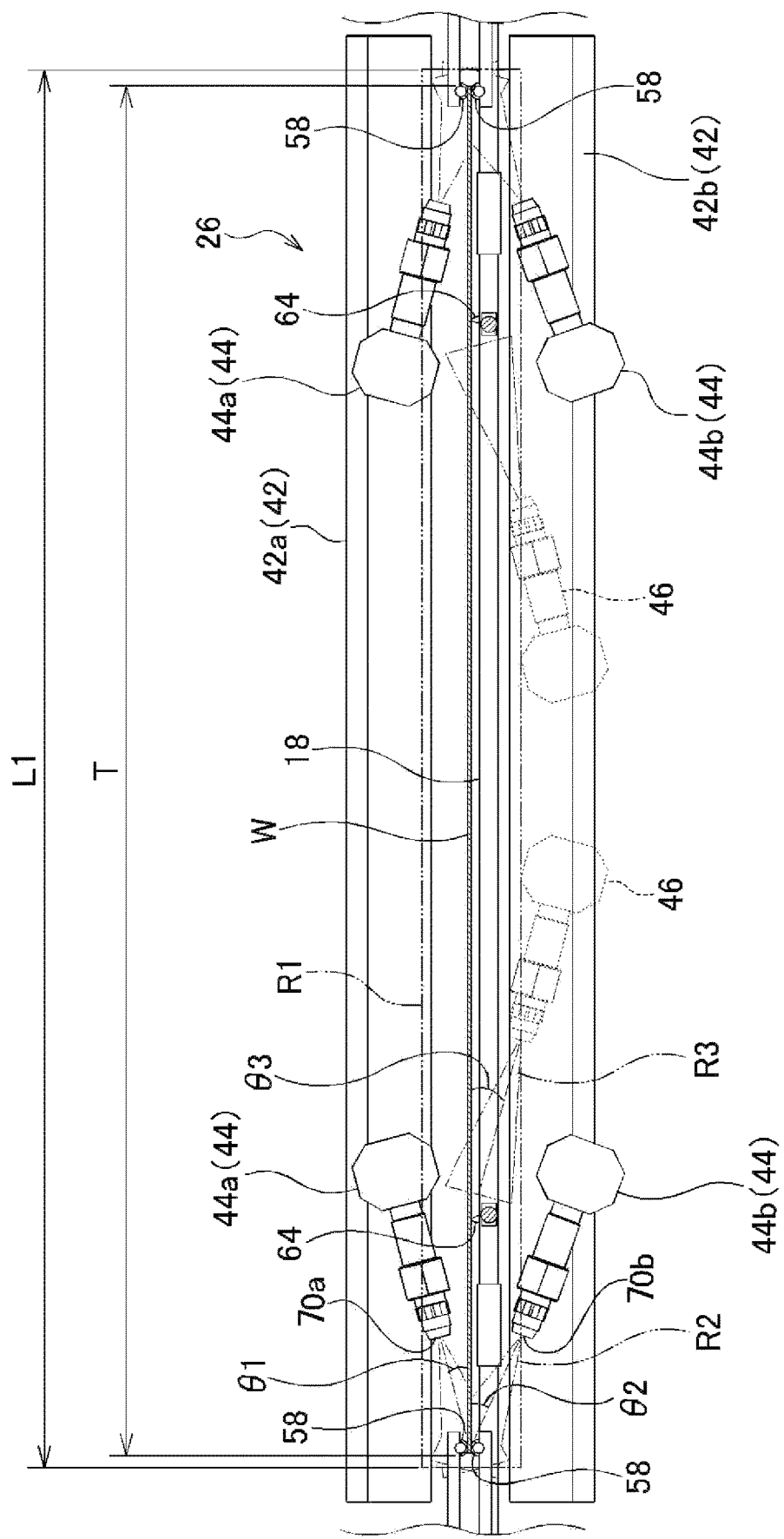
FIG. 8 is a schematic view illustrating a configuration relationship of nozzles.
Figure 9:
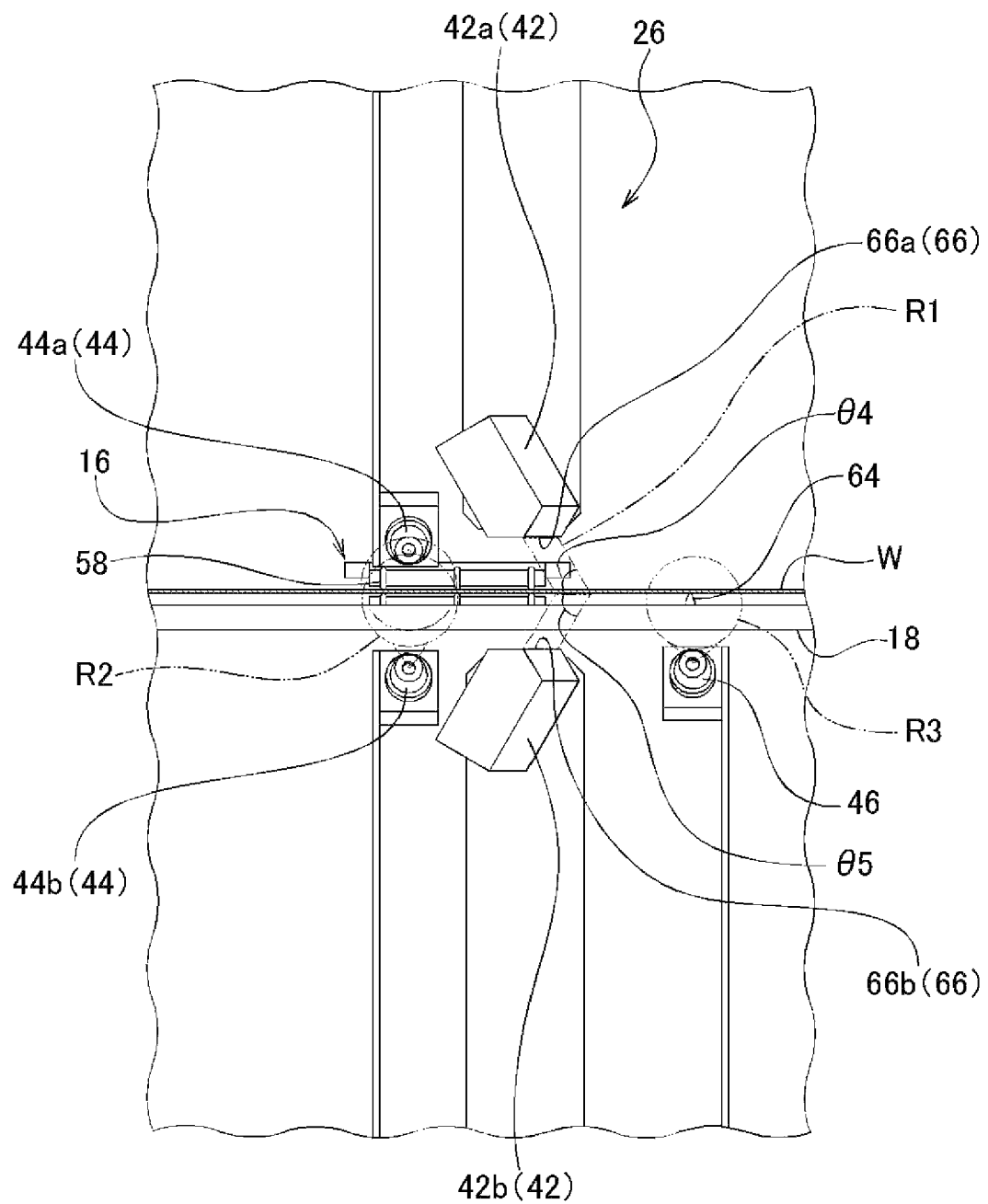
FIG. 9 is a schematic view illustrating a configuration relationship of nozzles.

FIGS. 8 and 9 are schematic views illustrating a configuration relationship of the nozzle mechanism 26. FIG. 8 is a drawing when the nozzle mechanism 26 is viewed from the rear surface side, and FIG. 9 is a drawing when the nozzle mechanism 26 is viewed from a side surface side. The two-dot dashed lines in the respectively drawings illustrate the regions of the gas ejected by the respective nozzles. In the following, such region is referred to as "gas ejection region". In addition, the gas ejection region of the air knife 42 may be defined as an ejection region R1, the gas ejection region of the gripping nozzle 44 may be referred to as an ejection region R2, and the gas ejection region of the support part nozzle 46 may be referred to as an ejection region R3. In FIG. 9, the arrow sign indicates the movement direction of the nozzle mechanism 26.

As shown in FIG. 8, in the ejection region R1, a length L1 in the extending direction of the air knife 42 is set to be greater than the left-right width of the substrate W. In other words, the length of the opening part 66 (as shown in FIG. 6) in the extending direction is set to be greater than a left-right width T of the substrate W. Therefore, the gas ejected from the air knife 42 can be ejected across the entire width direction of the substrate W.

The gripping part nozzles 44a eject gas to the O-rings 58 contacting the exterior surface of the substrate W to dry the exterior surface of the substrate W. In addition, the gripping part nozzles 44b eject gas to the O-rings 58 contacting the back surface of the substrate W to dry the back surface of the substrate W. The holding part nozzles 44a function as "upper gripping part nozzles", and the holding part nozzles 44b function as "lower gripping part nozzles".

The gripping part nozzles 44 eject gas so as to cover the O-rings 58 on the exterior surface of the substrate W in the ejection regions R2. The gripping part nozzles 44a are inclined with respect to the exterior surface of the substrate W. In addition, the gripping part nozzles 44b are inclined with respect to the back surface of the substrate W. Regarding the inclination angle with respect to the substrate W, an inclination angle θ1 of the gripping part nozzle 44a is 20°, and an inclination angle θ2 of the gripping part nozzle 44b is 25°.

As described with reference to (b) of FIG. 3, two O-rings 58 paired in the upper-lower direction are disposed in the thickness direction (upper-lower) of the substrate W. In addition, as described with reference to FIG. 7, the opening parts 70a and 70b are disposed in the upper-lower direction. Meanwhile, as shown in FIG. 8, the support part 18 is provided between the back surface of the substrate W and the gripping part nozzles 44b. The gripping part nozzles 44b are provided below the substrate W so as not to interfere with the support part 18. That is, the distance between the opening part 70b and the back surface of the substrate W is greater than the distance between the opening part 70a and the exterior surface of the substrate W. Therefore, compared with the inclination angle θ1 of the gripping part nozzles 44a ejecting gas with respect to the exterior surface of the substrate W, the inclination angle θ2 of the gripping part nozzles 44b ejecting gas with respect to the back surface of the substrate W is greater.

The support part nozzles 46 eject gas to the support pins 64 to dry the back surface of the substrate W. The pair of support part nozzles 46 eject gas so as to cover the contact positions with the support pins 64 on the back surface of the substrate W in the ejection regions R3. The support part nozzles 46 are also inclined with respect to the back surface of the substrate W, and an inclination angle θ3 thereof is 25°.

As shown in FIG. 9, the air knife 42 is inclined with respect to the exterior surface or the back surface of the substrate W so as to eject gas with respect to the front of the movement direction. The ejection region R1 of the air knife 42a and the ejection region R1 of the air knife 42b are set to overlap in the thickness direction of the substrate W. The ejection direction of the gas ejected from the air knife 42a has an inclination angle θ4 of 70° with respect to the exterior surface of the substrate W. In addition, the ejection direction of the gas ejected from the air knife 42b has an inclination angle θ5 of 75° with respect to the back surface of the substrate W.

As described with reference to FIG. 2, the opening parts 66a and 66b are disposed in the upper-lower direction. As shown in FIG. 9, the support part 18 is disposed between the air knife 42b and the back surface of the substrate W. The air knife 42b is provided below the substrate W so as not to interfere with the support part 18. That is, the distance between the opening part 66b and the back surface of the substrate W is greater than the distance between the opening part 66a and the exterior surface of the substrate W. Therefore, compared with the inclination angle θ4 of the air knife 42a ejecting gas with respect to the exterior surface of the substrate W, the inclination angle θ5 of the air knife 42b ejecting gas with respect to the back surface of the substrate W is greater.

From the front of the movement direction of the nozzle mechanism 26, the support part nozzles 46, the air knives 42, and the gripping part nozzles 44 are disposed in order. Details about the arrangement of the support part nozzles 46, the air knives 42, and the gripping part nozzles 44 will be described in the following.

Figure 10:
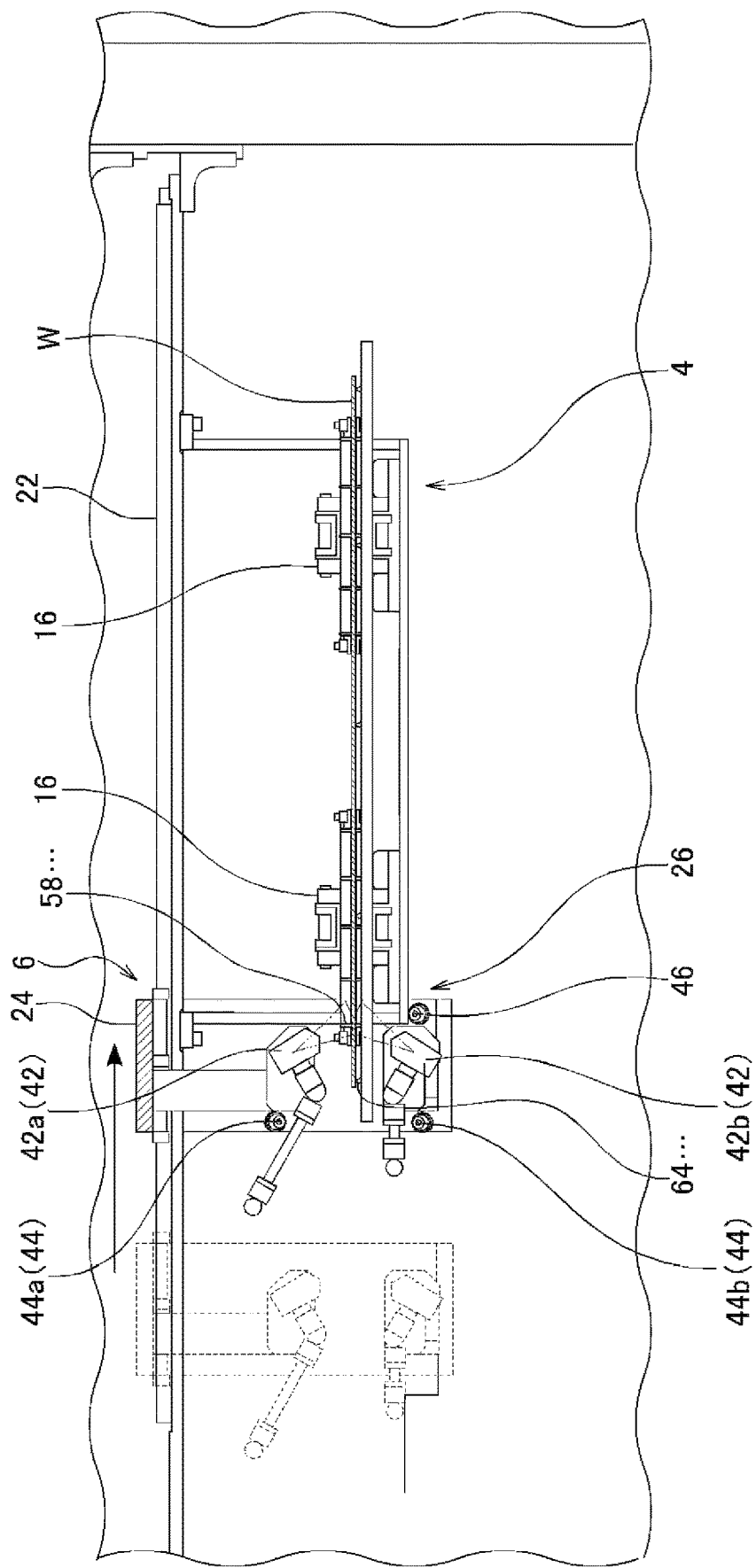
FIG. 10 is a view illustrating a driving state of the drying mechanism during a drying process.

FIG. 10 is a view illustrating a driving state of the drying mechanism 6 during a drying process.

At the time of drying the substrate W, the drying mechanism 6 is driven in a state in which the substrate W is supported by the support mechanism 4. At this time, the nozzle mechanism 26 ejects gas toward the substrate W while the drying mechanism 6 moves along the guide rail 22 as shown in the drawing. The nozzle mechanism 26 is supported by the support stand 24. That is, the air knives 42, the gripping part nozzles 44, and the support part nozzles 46 are supported by the common support stand 24. In the drying process, the support part nozzles 46, the air knives 42, and the gripping part nozzles 44 pass through the top and bottom of the substrate W in such order.

Figure 11:
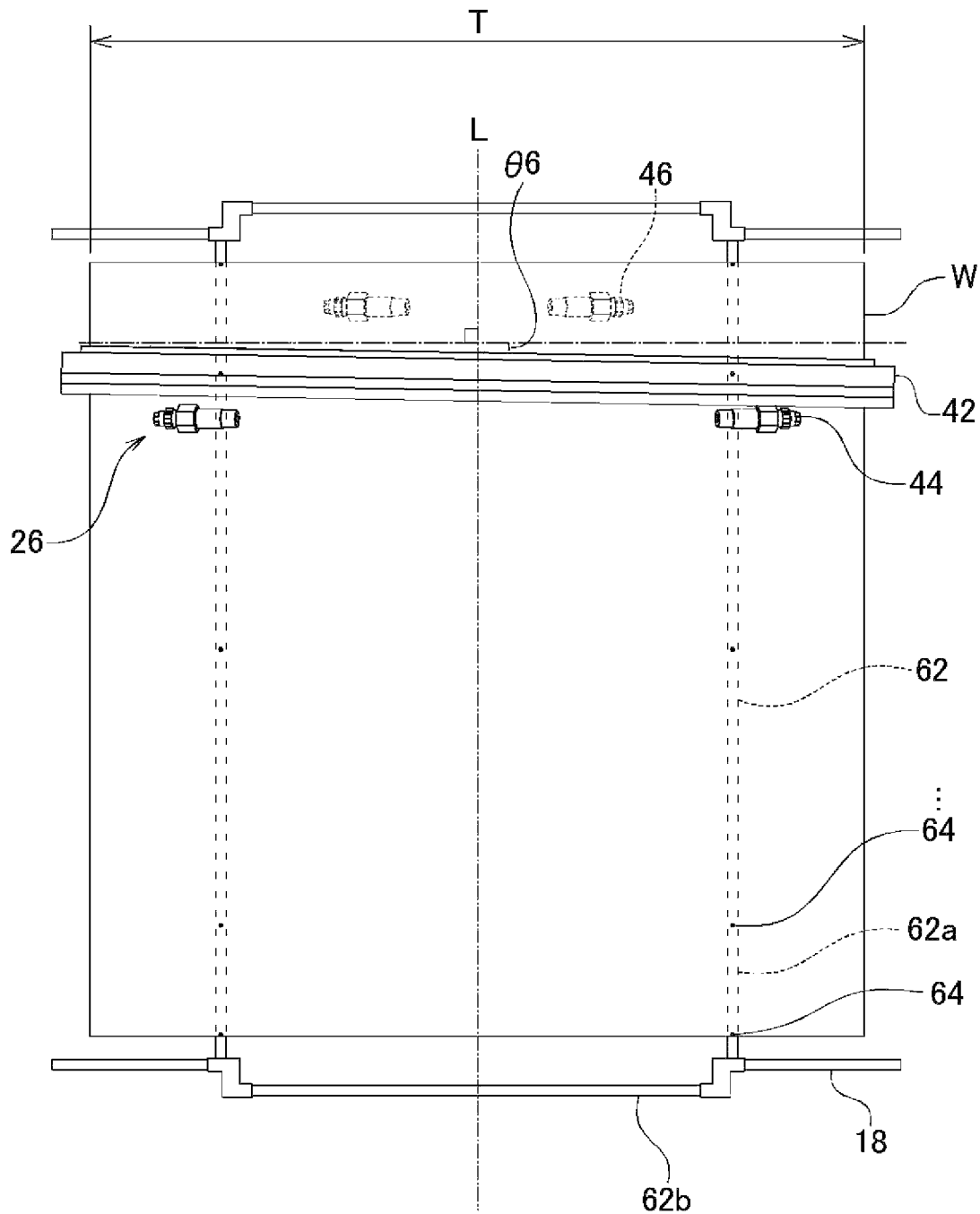
FIG. 11 is a schematic view illustrating a position relationship of nozzles with respect to a substrate.

FIG. 11 is a schematic view illustrating a position relationship of the nozzle mechanism 26 with respect to the substrate W in the drying process in a mode of viewing the substrate W planarly. In FIG. 11, the upper side is the front side of the traveling direction of the nozzle mechanism 26, and the lower side is the rear side of the traveling direction.

As shown in FIG. 11, in the embodiment, the support part 18 supports the substrate W in a mode in which the long sides of the substrate W are parallel to the long sides 62a of the support member 62. The movement direction of the nozzle mechanism 26 is parallel to the long sides 62a of the support member 62. When the nozzle mechanism 26 is moved while ejecting gas from the air knives 42 to the substrate W, the treatment liquid remaining on the surface of the substrate W also moves toward the front of the traveling direction of the nozzle mechanism 26. In the following, a line parallel to the long sides of the substrate W (the long sides 62a of the support member 62) and passing through the center of the surface of the substrate W is referred to as "central line L".

The extending directions of the air knives 42 are slightly inclined to the front-rear direction with respect to the traveling direction thereof. An inclination angle θ6 thereof is 1° to 6° with respect to the direction perpendicular to the central line L. Due to the inclination, the treatment liquid attached to both sides of the substrate W are eventually collected at the foremost corner of the substrate W to be blown away. Therefore, the substrate W can be reliably dried. The lengths (the length perpendicular to the movement direction) of the gas ejection regions (the gas ejection regions R1 in FIG. 8) of the air knives 42 are set to be greater than the left-right width T of the substrate W even in the case where the inclination angle θ6 is present.

The ejection directions of gas of the support part nozzles 46 and the gripping part nozzles 44 are oriented to be 90° with respect to the traveling direction of the nozzle mechanism 26 (directions perpendicular to the central line L of the substrate W). The support part nozzles 46 and the gripping part nozzles 44 are spray nozzles, and locally eject gas with respect to the target. That is, both of them push the treatment liquid toward a direction away from the central line L of the substrate W. By arranging the ejection directions of gas of the support part nozzles 46 and the gripping part nozzles 44 in this way, the treatment liquid can be effectively removed from the substrate W.

The support part nozzles 46 are disposed at positions relatively close to the central line L. Meanwhile, the gripping part nozzles 44 are disposed at positions further from the central line L than those of the support part nozzles 46. The position relationship is that the support part 18 supports the lower surface of the substrate W and disposed at a position closer to the central line L, while the clamp mechanism 16 (as shown in FIG. 5) grips the outer periphery part of the substrate W and is disposed at a position further from the central line.

By using the gas ejected from the support part nozzles 46, the remaining treatment liquid at the contact positions with the support part 18 and the vicinities thereof on the substrate W is pushed toward the outer periphery part of the substrate W. In addition, by using the gas ejected from the gripping part nozzles 44, the remaining treatment liquid in the vicinities of the gripping positions of the clamp mechanism 16 (as shown in FIG. 5) on the substrate W is pushed toward the outer periphery part of the substrate W. Since the gripping positions of the clamp mechanism 16 are close to the outer periphery part of the substrate W, the remaining treatment liquid in the vicinities of the gripping positions on both sides of the substrate W is blown off. Meanwhile, since the contact positions of the support part 18 are further away from the outer periphery part of the substrate W than the gripping positions, with the gas ejected from the support part nozzles 46 only, the remaining liquid at the contact positions cannot reach the outer periphery end of the substrate W, and it is possible that the remaining liquid is not completely removed from the back surface of the substrate W.

Therefore, in the embodiment, the remaining treatment liquid at the contact positions of the support part 18 and the vicinities thereof on the substrate W is pushed to a position close to the outer periphery part of the substrate W by the support part nozzles 46 and then removed from the substrate by the air knives 42. By ejecting gas to the substrate W using the support part nozzles 46 and then using the air knives 42, the remaining treatment liquid at the contact positions of the support part 18 and the vicinities thereof can be reliably removed from the back surface of the substrate W.

On the substrate W, the treatment liquid may also be easily accumulated in the vicinities of the O-rings 58 (as shown in FIG. 8). By using the gripping part nozzles 44, the treatment liquid collected at such positions is also removed from both sides of the substrate W.

It is assumed that the gas ejection by the gripping part nozzles 44 toward the substrate W is performed prior to the gas ejection from the air knives 42. In such case, even if the treatment liquid accumulated in the vicinities of the O-rings 58 (as shown in FIG. 8) is removed through the ejection using the gripping part nozzles 44, due to the air knives 42, it is possible that the remaining treatment liquid behind the O-rings 58 (the upstream side of the traveling direction of the air knives 42) may move to the vicinities of the O-rings 58. As a result, the concern that the vicinities of the O-rings 58 are wet by the treatment liquid again may arise. Therefore, in the embodiment, the gas ejection by the gripping part nozzles 44 is performed after the gas ejection by the air knives 42. By adopting such mode, the treatment liquid can be prevented from being attached to the vicinities of the O-rings 58 again. Therefore, the substrate W can be reliably dried.

Figure 12:
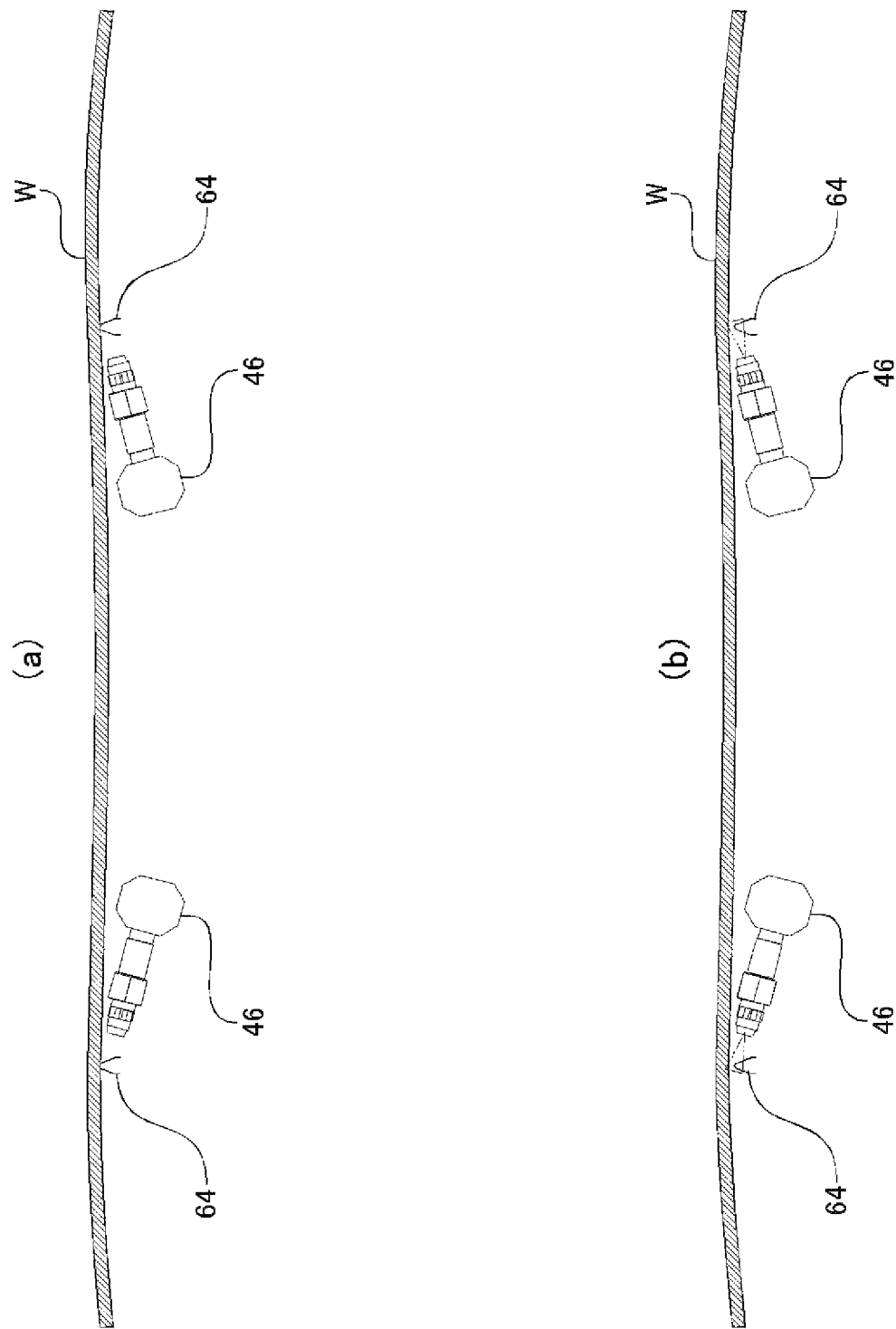
FIG. 12 is a schematic view illustrating a state of the substrate when gas is ejected.

FIG. 12 is a schematic view illustrating a state of the substrate W when gas is ejected by the support part nozzles 46. (a) of FIG. 12 illustrates a state before gas ejection, and (b) of FIG. 12 illustrates a state during gas ejection.

As shown in (a) of FIG. 12, when the substrate W is supported by the support pins 64, the contact points of the substrate W with the support points 64 serve as support points, and the outer periphery part and the central part of the substrate W are bent downward due to its own gravity. When the substrate W is supported by the support pins 64 right after the cleaning process, the treatment liquid may remain at the contact positions with the support pins 64 on the substrate W.

As shown in (b) of FIG. 12, when gas is ejected from the support part nozzles 46 toward the support pins 64 (the back surface of the substrate W), the contact between the substrate W and the support pins 64 is temporarily removed due to the discharge pressure of the gas. Accordingly, when the gas enters between the substrate W and the support pins 64, the treatment liquid present at these contact positions can be pushed away from the contact positions.

When the gas ejection by the support part nozzles 46 is completed, the substrate W is again supported by the support pins 64, and the state returns to the state of (a) of FIG. 12. Then, as described with reference to FIG. 11, the gas ejection by the air knives 42 is performed.

When gas is ejected by the air knives 42 (as shown in FIG. 11), the substrate W remains supported by the support pins 64 as shown in (a) of FIG. 12. Assuming that the contact between the substrate W and the support pins 64 is removed by the air knives 42, the concern that the treatment liquid pushed by the air knives 42 is moved to the contact locations of the support pins 64 with the substrate W may arise. In addition, when the gas ejection by the air knives 42 is completed and the substrate W is again supported by the support pins 64, it is possible that the treatment liquid remains between the substrate W and the support pins 64.

Therefore, in the embodiment, it is set that the contact between the substrate W and the support pins 64 is removed at the time of the gas ejection by the support part nozzles 46, while the contact therebetween is maintained at the time of the gas ejection by the air knives 42. As described with reference to FIGS. 6 and 7, it is set that the discharge pressure of the gas ejected by the support part nozzles 46 is greater than the discharge pressure of the gas ejected by the air knives 42. Accordingly, it can be achieved that the treatment liquid between the support pins 64 and the substrate W (as shown in (a) and (b) of FIG. 12) is removed by the support part nozzles 46 while the the treatment liquid moved by the gas ejection by the air knives 42 does not enter between the substrate W and the support pins 64.

As described with reference to (a) of FIG. 12, the substrate W is bent with the contact points with the support pins 64 being the contact points. Therefore, after the gas ejection by the support part nozzles 46, due to its own gravity, the treatment liquid remaining on the back surface of the substrate W quickly leaves the support pins 64 along the deflection of the substrate W, and is pushed toward the end part of the substrate W and removed through the gas ejection by the air knives 42.

Then, the timing of gas ejection from the nozzle mechanism 26 is described based on FIGS. 1 and 9 to 11.

At the beginning of the drying process, the control part 28 arranges the drying mechanism 6 at an initial position in the substrate drying apparatus 1. The initial position is set as a position that does not obstruct the conveyance of the substrate W at the time when the substrate W is loaded to the substrate drying apparatus 1. Then, the substrate W with the remaining treatment liquid after the cleaning process is mounted to the support part 18 and is loaded to the substrate drying apparatus 1. Then, the clamp mechanism 16 grips the outer periphery part of the substrate W. The substrate W is positioned in the substrate drying apparatus 1 by the clamp mechanism 16 and the support part 18.

Then, the drying mechanism 6 arranged at the initial position by the control part 28 starts moving and beings to eject gas toward the surface of the substrate W. At the time of ejection, the gas is ejected at the moment when the gas injection region of the nozzle mechanism 26 approaches each ejection target. Firstly, when the nozzle mechanism 26 reaches the position where the ejection regions R3 approach the rearmost support pins 64 (e.g., the lowest support pins 64 in FIG. 11), the support part nozzles 46 start ejecting gas. Then, when the nozzle mechanism 26 reaches the position where the ejection regions R1 approach the end part of the substrate W, the air knives 42 start ejecting gas. Then, when the nozzle mechanism 26 reaches the position where the ejection regions R2 approach the rearmost O-rings 58 (e.g., the leftmost O-ring 58 in FIG. 10), the gripping part nozzles 44 start ejecting gas.

Each gas ejection stops after the gas ejection region passes through each ejection target. The gas ejection by the support part nozzles 46 is stopped after the gas ejection regions R3 pass through the foremost support pins 64 (e.g., the uppermost support pins 64 in FIG. 11). In other words, the gas ejection by the support part nozzles 46 is performed continuously from the time when the ejection regions R3 approach the rearmost support pins 64 until the ejection regions R3 pass through the foremost support pins 64. Similarly, the gas ejection by the gripping part nozzles 44 is stopped after the gas ejection regions R2 pass through the foremost O-rings 58 (e.g., the rightmost O-ring 58 in FIG. 10). The air knives 42 stop ejecting gas after the ejection region R1 pass through the substrate W.

The drying mechanism 6 does not reciprocate the drying process with respect to the substrate W, but ends in a unidirectional operation When the unidirectional operation ends, the drying mechanism 6 returns to the initial position. The clamp mechanism 16 removes the clamping, and the substrate W is unloaded by using a conveyance apparatus not shown herein.

As described above, according to the embodiment, the gripping part nozzles 44 are disposed behind the air knives 42. Accordingly, the remaining liquid in the vicinities of the O-rings 58 which remains even after the substrate W is dried by the air knives 42 can be removed from both sides of the substrate W by the gripping part nozzles 44. That is, the exterior surface and the back surface of the substrate W can be reliably dried by the air knives 42 and the gripping part nozzles 44.

According to the embodiment, the gripping part nozzles 44 and the air knives 42 can be integrally displaced. Accordingly, the drying of the substrate W can be performed while maintaining the position relationship between the gripping part nozzles 44 and the air knives 42. Therefore, it is not necessary to adjust the position relationship thereof each time, and the entire substrate W can be dried in a simple manner.

According to the embodiment, the length of the extending direction of the opening part 66 of the air knife 42 is set to be greater than the width of the substrate W. Accordingly, the entirety of both sides of the substrate W can be dried by the air knives 42.

According to the embodiment, the support part nozzles 46 are disposed in front of the of the air knives 42. Accordingly, the remaining treatment liquid at the contact locations with the support pins 64 on the substrate W can be effectively removed. Therefore, the entire substrate W can be reliably dried.

According to the embodiment, the surface of the substrate W is kept level by the support part 18. Accordingly, the drying mechanism 6 can be simply moved in parallel with the substrate W. That is, during the drying of the substrate W, the distance between the drying mechanism 6 and the substrate W can be kept constant. Therefore, the gas can be ejected onto the substrate W at a constant discharge pressure from the beginning to the end of the drying, and the drying can be performed evenly on both sides of the substrate W.

Although the exemplary embodiment of the invention has been described above, the invention is not limited to the specific embodiments, and it goes without saying that various modifications can be made within the scope of the technical concept of the invention.

In the embodiment, the drying mechanism is moved with respect to the substrate whose position is fixed. In a modified example, the substrate may be moved with respect to the drying mechanism whose position is fixed. That is, at the time of drying the substrate, it suffices as long as the substrate and the drying mechanism are relatively movable.

In the above embodiment, the air knives, the gripping part nozzles, and the support part nozzles are disposed on the same support stand, so as to be integrally displaceable. In a modified example, these nozzles may also be individually controlled and driven.

In the above embodiment, the air knives, the gripping part nozzles, and the support part nozzles are supplied with gas from the same gas supply source. In a modified example, these nozzles may also be supplied with gas from separate gas supply sources. Even in such case, it suffices as long as the control part controls the amount of gas ejected from each nozzle and the ejection timing. Also, different types of gas may be supplied with respect to the exterior surface and the back surface of the substrate. In addition, the gas supply source may be provided in the substrate drying apparatus, and may also be disposed externally with respect to the substrate drying apparatus and supply gas to the respective nozzles.

In the above embodiment, the substrate is stably supported not only through the gripping of the substrate by the clamp mechanism but also through the support to the substrate by the support part. In a modified example, it may be that only the clamp mechanism is adopted and the substrate is supported only by gripping. In such case, it suffices as long as the air knives and the gripping part nozzles are adopted as the nozzle mechanism. In the case where the substrate is a large-scale substrate, there is a case where the substrate is not fully supported by only the clamp mechanism. A suitable support part may be adopted in correspondence with the size of the substrate.

Also, in the modified example, it may also be that only the support part is adopted. In such case, it suffices as long as the air knives and the support part nozzles are adopted as the nozzle mechanism. In the case where the contact relationship between the substrate and the support part is removed at the time of ejecting gas by the support art nozzles, the concern that the substrate is deviated from the support part may arise. Thus, the clamp mechanism may be adopted to stably support the substrate.

In the above embodiment, the protrusive support pins are adopted as the parts supporting the substrate. In a modified example, the shape of the pin is not limited, and various shapes, such as a semi-spherical shape, may also be adopted to support the substrate. In addition, further to the mode of point contact with the substrate, a mode of surface contact by a support sheet, etc., may also be adopted. In either case, the remaining liquid may be suppressed if the contact area with the substrate is reduced.

In the above embodiment, the substrate drying apparatus is used on the substrate on which the treatment liquid is remaining after the cleaning process following the plating process. However, the use of the substrate drying apparatus is not limited to the case of removing the cleaning liquid after plating, and can be used in various drying processes with respect to the substrate, such as drying a wet substrate which is cleaned after a substrate treatment.

In the above embodiment, the air knives are slightly inclined with respect to the direction perpendicular to the traveling direction thereof. In a modified example, the air knives may extend in a direction perpendicular to the traveling direction. In addition, regarding the support part nozzles and the gripping part nozzles, while the opening parts thereof are disposed toward the direction perpendicular to the traveling direction (direction at an angle of 90° with respect to the traveling direction), these opening parts may also be slightly inclined with respect to the traveling direction. Regarding the support part nozzles and the gripping part nozzles, it suffices as long as the gas can be ejected toward a direction intersecting with the traveling direction. With such a configuration, the remaining treatment liquid at the contact positions with the support part on the substrate and the vicinities thereof can be removed by the support part nozzles and the air knives. In addition, the treatment liquid remaining in the vicinities of the contact positions with the gripping parts on the substrate can be removed by the gripping part nozzles.

In the above embodiment, the inclination angles of the air knives with respect to the surface of the substrate are set to be 70° to 75°. In addition, the inclination angles of the support part nozzles and the gripping part nozzles are set to be 20° to 25°. In a modified example, gas may be ejected to the surface of the substrate with greater inclination. It suffices as long as the inclination angles of these nozzles are suitably set in correspondence with the size, etc., of the substrate drying apparatus. Meanwhile, in the case where gas is ejected to both sides of the substrate, it may be that the gas is also ejected to a place located right behind the position where the gas is ejected on one of the surfaces of the substrate. In this mode, in the case where the substrate is supported by the support part, the inclination angle of the nozzle mechanism disposed on an upper side to the substrate with respect to the surface of the substrate is smaller than the inclination angle of the nozzle mechanism disposed on a lower side to the substrate with respect to the surface of the substrate.

In the above embodiment, a square substrate is adopted as a applicable target of the substrate drying apparatus. In a modified example, the applicable target of the substrate drying apparatus may also be a substrate of other shapes, such as a circular substrate. For example, in the case where the periphery part of the circular substrate is gripped by a plurality of gripping parts, it suffices as long as the substrate drying apparatus includes dedicated gripping part nozzles with respect to the gripping parts.

The invention is not limited to the above-described embodiment or modification, and the components can be modified and embodied without departing from the gist. Various inventions may be formed by appropriately combining a plurality of components disclosed in the above embodiments and modifications. In addition, some components may be deleted from all the components shown in the above embodiments and modifications.

What is claimed is:

1. A substrate drying apparatus, comprising:
   a clamp mechanism having a gripping part, wherein the gripping part grips an outer periphery part of a substrate that is square;
   a substrate nozzle, ejecting gas to at least one of an exterior surface and a back surface of the substrate gripped by the gripping part to dry the substrate; and
   a gripping part nozzle, ejecting gas to the gripping part, that contacts the at least one of the exterior surface and the back surface of the substrate, to dry the substrate,
   wherein the substrate nozzle is relatively movable with respect to the substrate in a first direction, and is able to eject the gas in the first direction toward the substrate,
   the gripping part nozzle is relatively movable with respect to the substrate in the first direction, and is able to eject the gas in a second direction intersecting with the first direction, and
   the gripping part nozzle is disposed behind the substrate nozzle in the first direction.

2. The substrate drying apparatus as claimed in claim 1, wherein the substrate nozzle is able to eject the gas from an opening part that is slit-like, and
   a length of an extending direction of the opening part is greater than a width of the substrate.

3. The substrate drying apparatus as claimed in claim 1, wherein the substrate nozzle and the gripping part nozzle are integrally displaceable.

4. The substrate drying apparatus as claimed in claim 1, wherein the gripping part nozzle comprises:
- an upper gripping part nozzle, ejecting the gas to the exterior surface of the substrate; and
- a lower gripping part nozzle, ejecting the gas to the back surface of the substrate,
- wherein the upper gripping part nozzle and the lower gripping part nozzle are respectively disposed to be inclined with respect to the substrate.

5. The substrate drying apparatus as claimed in claim 1, further comprising:
- a support part, supporting the substrate; and
- a support part nozzle, ejecting gas to the support part to dry the substrate,
- wherein the support part nozzle is movable with respect to the substrate in the first direction, is able to eject the gas in a third direction intersecting with the first direction, and is disposed in front of the substrate nozzle in the first direction.

6. The substrate drying apparatus as claimed in claim 5, wherein the support part comprises a support pin supporting the substrate.

7. The substrate drying apparatus as claimed in claim 5, wherein the support part supports the substrate so that the at least one of the exterior surface and the back surface of the substrate is level.

\* \* \* \* \*